United States Patent
Ebizuka et al.

(10) Patent No.: US 9,401,297 B2
(45) Date of Patent: Jul. 26, 2016

(54) ELECTROSTATIC CHUCK MECHANISM AND CHARGED PARTICLE BEAM APPARATUS

(71) Applicant: Hitachi High-Technologies Corporation, Minato-ku, Tokyo (JP)

(72) Inventors: Yasushi Ebizuka, Tokyo (JP); Seiichiro Kanno, Tokyo (JP); Masaya Yasukochi, Tokyo (JP); Masakazu Takahashi, Tokyo (JP); Naoya Ishigaki, Tokyo (JP); Go Miya, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/626,116

(22) Filed: Feb. 19, 2015

(65) Prior Publication Data

US 2015/0262857 A1    Sep. 17, 2015

(30) Foreign Application Priority Data

Mar. 14, 2014 (JP) ................................. 2014-050971

(51) Int. Cl.
| | |
|---|---|
| *H01J 37/20* | (2006.01) |
| *H01L 21/683* | (2006.01) |
| *H01J 37/28* | (2006.01) |
| *H01J 37/244* | (2006.01) |

(52) U.S. Cl.
CPC ............. *H01L 21/6833* (2013.01); *H01J 37/20* (2013.01); *H01J 37/244* (2013.01); *H01J 37/28* (2013.01); *H01J 2237/004* (2013.01); *H01J 2237/2007* (2013.01)

(58) Field of Classification Search
USPC ................. 250/440.11, 441.11, 442.11, 443.1
See application file for complete search history.

(56) References Cited

U.S. PATENT DOCUMENTS

| | | | |
|---|---|---|---|
| 2009/0309043 A1 | 12/2009 | Nobuhara et al. | |
| 2011/0095185 A1* | 4/2011 | Miya ...................... | H01J 37/20 250/311 |
| 2012/0070066 A1 | 3/2012 | Kitsunai et al. | |

FOREIGN PATENT DOCUMENTS

| | | |
|---|---|---|
| JP | 2009-302415 A | 12/2009 |
| JP | 5143787 B2 | 2/2013 |

* cited by examiner

*Primary Examiner* — Nicole Ippolito
(74) *Attorney, Agent, or Firm* — Crowell & Moring LLP

(57) ABSTRACT

Proposed are an electrostatic chuck mechanism and a charged particle beam apparatus including a first plane that is a plane of a side in which a sample is adsorbed, a first electrode to which a voltage for generating an adsorptive power between the first plane and the sample is applied, and a second electrode that is arranged in a position relatively separated from the sample toward the first plane and through which a virtual line that is perpendicular to the first plane and contacts an edge of the sample passes, wherein the first plane is formed so that a size in a plane direction of the first plane is smaller than that of the sample.

10 Claims, 17 Drawing Sheets

US 9,401,297 B2

ELECTROSTATIC CHUCK MECHANISM AND CHARGED PARTICLE BEAM APPARATUS

BACKGROUND OF THE INVENTION

The present invention relates to an electrostatic chuck mechanism and a charged particle beam apparatus, and particularly to an electrostatic chuck mechanism capable of effectively suppressing an influence of an electric field generated near an edge of a sample, and a charged particle beam apparatus.

Miniaturization of a semiconductor device progresses exponentially and a semiconductor device manufactured by a size of several tens of nanometer order becomes mainstream in recent years. In a manufacturing line for a semiconductor device having such a fine structure, an apparatus to which a scanning electron microscope is applied is used to perform a size measurement of a fine pattern or inspect defects of devices. For example, for the size measurement of a gate or a contact hole of a semiconductor device, a CD-SEM (Critical-Dimension Scanning Electron Microscope) is used, and for a defect inspection, a defect inspection SEM or the like is used. Further, also for a conduction inspection of deep holes for wiring, a scanning electron microscope is being used by a potential contrast.

In a charged particle beam apparatus typified by a scanning electron microscope, etc., an electrostatic chuck mechanism may be used as a holding mechanism for holding samples (semiconductor wafer and the like) as a target. An electrostatic chuck applies a voltage to a metal electrode provided therein, generates a positive or negative charge on surfaces of an object to be adsorbed and the electrostatic chuck, and fixes the object to be adsorbed by a coulomb force, etc. working therebetween. On the other hand, when an electrostatic chuck is adopted as a sample holding mechanism for an electron microscope, etc., a strong electric field formed between a sample and the electrostatic chuck may disturb a potential distribution in a periphery of a wafer (sample). As a result, there is the possibility that electron beams are bent and therefore cannot be irradiated on an appropriate position near the periphery of the wafer. In JP5143787 (US2012/0070066), disclosed is a method in which an adsorption electrode of an electrostatic chuck is made larger than the wafer and an electric field near an edge of the wafer is uniformized by an electric field generated by a portion protruding from the wafer. Further, in JP-A-2009-302415 (US2009/0309043), disclosed is an electrostatic chuck mechanism in which an electric-field correction part having the same height as that of a sample surface is arranged near a periphery of the sample.

SUMMARY OF THE INVENTION

According to the electrode having a diameter larger than that of the periphery of the wafer disclosed in JP5143787 (US2012/0070066), and the electric-field correction part disclosed in JP-A-2009-302415 (US2009/0309043), a disturbance in a potential distribution generated in the periphery of the wafer can be suppressed. On the other hand, it is apparent from a study of the inventors that when the sample is mounted on the electrostatic chuck, a charge may be generated near an edge of the sample through a contact therebetween. Further, a charge is also considered in which secondary electrons, etc. generated at the time of irradiating electron beams on the vicinity of the edge of the sample are attached to the electrostatic chuck. There is the possibility that electron beams are bent also by the above charge.

Also by applying a voltage to the electrode for correction as disclosed in JP5143787 (US2012/0070066) and JP-A-2009-302415 (US2009/0309043), an influence of an electric field on electron beams can be relieved to some extent. However, when a plurality of types of electric fields are complexed as described above, it is difficult to suppress the influence sufficiently.

Hereinafter, proposed are the electrostatic chuck mechanism that effectively suppresses an influence on electron beams of various electric fields generated near the edge of the sample, and the charged particle beam apparatus.

According to one embodiment for attaining the object, hereinafter, proposed are an electrostatic chuck mechanism including a first plane that is a plane of a side in which a sample is adsorbed, a first electrode to which a voltage for generating an adsorptive power between the first plane and the sample is applied, and a second electrode that is arranged in a position relatively separated from the sample toward the first plane and through which a virtual line that is perpendicular to the first plane and contacts an edge of the sample passes, wherein the first plane is formed so that a size in a plane direction of the first plane is smaller than that of the sample, and a charged particle beam apparatus.

According to the above configuration, it is possible to effectively suppress an influence of various electric fields generated near the edge of the sample.

Other objects, features and advantages of the invention will become apparent from the following description of the embodiments of the invention taken in conjunction with accompanying drawings.

DESCRIPTION OF THE EMBODIMENTS

Figure 1:
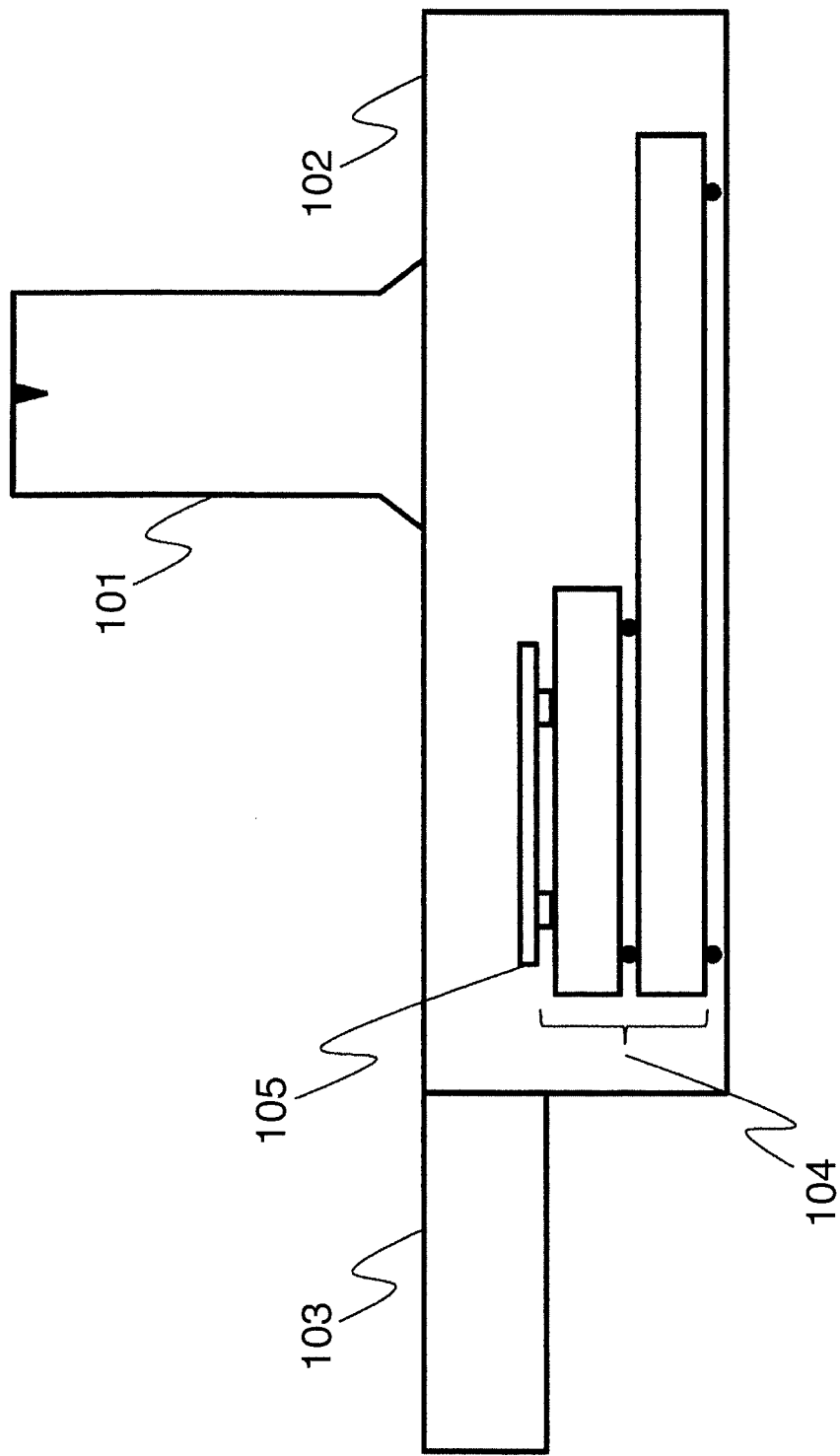
FIG. 1 illustrates an outline of a scanning electron microscope.

An embodiment as described below relates mainly to a scanning electron microscope that performs a measurement of a line width or a hole diameter of a fine pattern in a semiconductor device, and that performs a defect inspection and an image acquisition on the semiconductor device. First, a basic principle of an electron beam application device such as a scanning electron microscope will be simply described. A primary electron is discharged from an electron gun and is accelerated by applying a voltage. Thereafter, a beam diameter of an electron beam is thinly narrowed by an electromagnetic lens. The electron beams are two-dimensionally scanned on a sample such as a semiconductor wafer. The scanned electron beams enter into the sample, and thereby generated secondary electrons are detected by a detector. On an intensity of the secondary electron, a shape of a sample surface is reflected, and therefore scanning of the electron beam and detection of the secondary electron are synchronized with each other to be displayed on a monitor. The above process permits a fine pattern on the sample to be imaged. In a CD-SEM, for example, when a line width of a gate electrode is measured, a pattern edge is determined and a size is derived on the basis of a change in light and darkness of the obtained image. When a defect inspection SEM is used, a defect is recognized from the obtained image and is automatically classified.

These electron beam application devices are used for a size measurement and/or a defect inspection in a semiconductor manufacturing line. Therefore, not only performances of an electron microscope such as resolution and reproducibility of length measurement, but also throughput is extremely important.

A plurality of factors for determining the throughput are used. Particularly, a large influence is exerted on the throughput by a time required for an automatic focus at the time of acquiring an image and a movement speed of a stage on which a wafer is mounted.

Further, as a mechanism for holding a semiconductor wafer and the like being a target of the measurement or inspection, an electrostatic chuck mechanism is used. When a wafer can be stably fixed on the electrostatic chuck, it can be carried at high acceleration and high speed without dropping from the stage. Further, when the electrostatic chuck is used, the entire surface of a warped wafer or the like can be flattened and fixed thereon by a nearly equal force. Therefore, a height distribution in a wafer surface is uniformized and a time for determining a value of a current that flows in a coil of an objective lens for obtaining focusing, namely, an auto-focusing time is shortened.

In important performances of the CD-SEM or the defect inspection SEM, used is an index indicating an observable range, namely, how much wide range can be observed in a wafer surface. In the semiconductor manufacturing line, as many chips as possible are manufactured from a sheet of wafer, and thereby a manufacturing cost is desired to be suppressed. Therefore, also for inspecting whether a device is normally manufactured up to the periphery of the wafer, the observable range is strictly demanded for the electron beam application device.

On the other hand, when the electrostatic chuck is larger than the wafer, a charge may be formed on a surface of the electrostatic chuck. The electrostatic chuck is made of ceramics having a high insulation property, and therefore a charge may be generated by a contact or friction between the wafer and the electrostatic chuck, or by an irradiation of the electron beam. A charge formed near the edge of the wafer on the electrostatic chuck disturbs an electric field near the edge of the wafer. Therefore, an influence may be exerted on electron beams at the time of observing a vicinity of an edge of the next wafer to be carried and the observable range may be restricted.

For suppressing a disturbance of the electric field near the edge of the wafer, an electrode having an electric-field uniformizing function in addition to an adsorption function is considered to be used. It may be difficult to secure both of the electric-field uniformizing function and an original function as the electrostatic chuck such as a correction of the warped wafer or securement of a heat transfer between the wafer and the electrostatic chuck. Further, when an electric field on a surface of the wafer is controlled by an adsorption electrode of the electrostatic chuck, an electric field between a rear surface of the wafer and the adsorption electrode is extremely strong, and therefore a function to uniformize the electric field is also restricted by a limit of breakdown voltage.

In the embodiment described below, proposed is an electric-field uniformizing technique in which an influence that an internal electrode of the electrostatic chuck and a charge on the electrostatic chuck exert on electron beams is suppressed, it is easy to secure both of a heat transfer and an adsorptive power of the wafer, and the limit of breakdown voltage is hard to receive.

In the present embodiment, the electrostatic chuck mechanism in which an outer diameter of the electrostatic chuck is made smaller than that of the wafer, a conductive member is provided outside the electrostatic chuck, and an appropriate voltage is applied to the conductive member, and a charged particle beam apparatus using the electrostatic chuck mechanism will be described. According to the above configuration, the outer diameter of the electrostatic chuck is smaller than that of the wafer, and therefore an influence of the adsorption electrode of the electrostatic chuck and that of an electric field generated by charges on the electrostatic chuck are shielded by the wafer itself. Therefore, an observable range can be stably secured. In addition, since the electric-field uniformizing function is imparted independently of the adsorption electrode, it is easy to secure both of the electric-field uniformizing function and heat transfer characteristics as well as an adsorptive power being an original function of the electrostatic chuck. Further, in the conductive member, insulation can be secured through a vacuum space, and therefore the limit of breakdown voltage is also hard to receive.

Next, referring to drawings, a specific embodiment of the electrostatic chuck mechanism will be described. Further, for describing an effect of making the outer diameter of the electrostatic chuck (contact face with the wafer) smaller than that of the wafer, an embodiment in which the outer diameter of the electrostatic chuck is larger than that of the sample will be described collectively.

FIGS. 1 to 5 illustrate an outline of the charged particle beam apparatus including the electrostatic chuck mechanism. Here, the CD-SEM will be described as an embodiment. FIG. 1 illustrates an apparatus overall diagram. The charged particle beam apparatus is basically configured by a column 101 that controls an electron beam, a sample chamber 102 including an X-Y stage 104 on which an electrostatic chuck 105 that holds a sample is mounted, and a reserve exhaust chamber 103 that performs vacuum evacuation before carrying a wafer in the sample chamber. Air of the sample chamber 102 is exhausted by a vacuum pump (not illustrated). Further, the CD-SEM is controlled by a control device (not illustrated), and a voltage applied to the electrostatic chuck and peripheral electrodes is controlled under conditions as described below.

Figure 2:
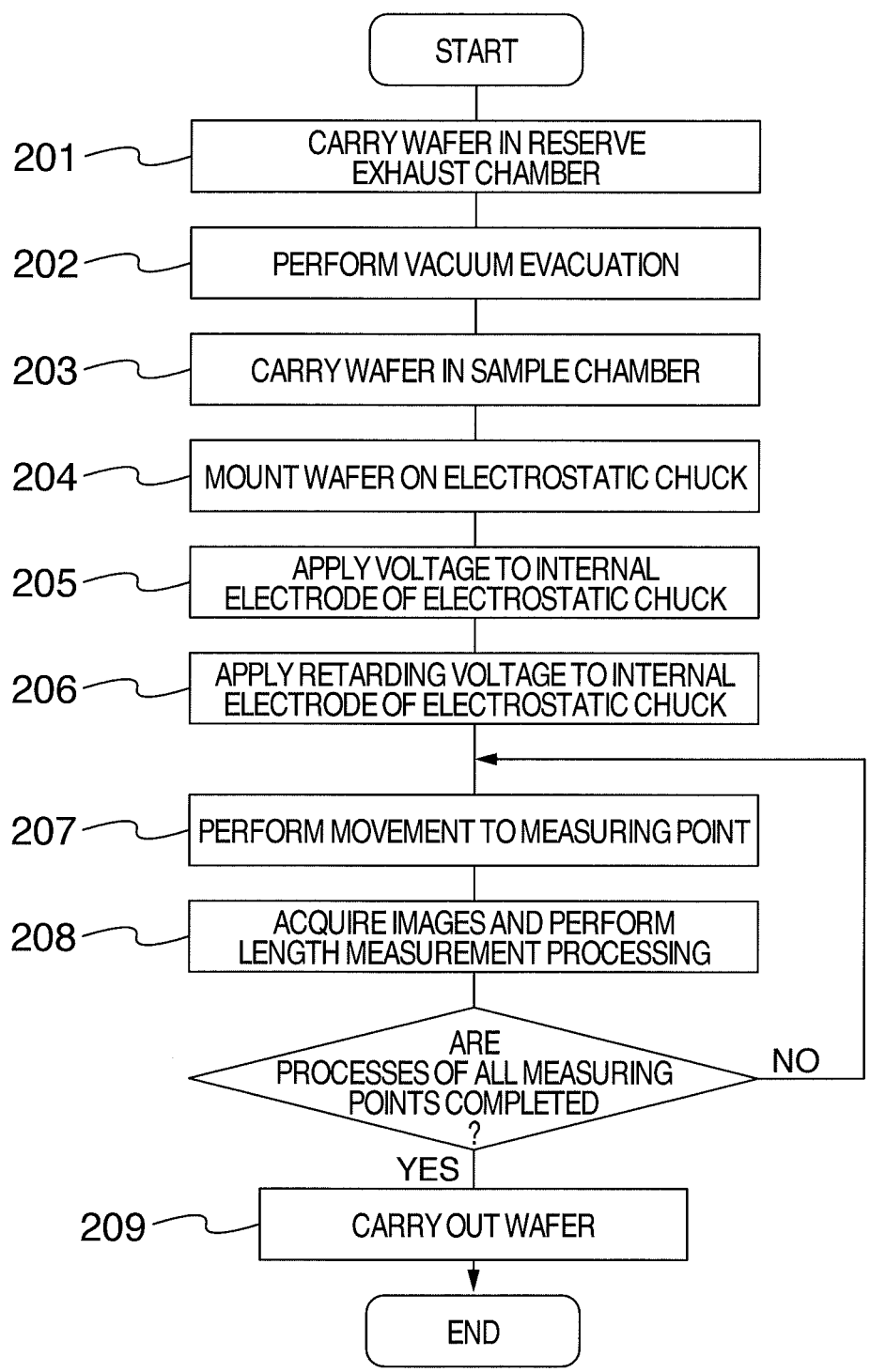
FIG. 2 is a flowchart illustrating a measurement process of a semiconductor wafer by using the scanning electron microscope.

FIG. 2 is a flowchart illustrating a measurement process by the CD-SEM. The wafer is first carried in the reserve exhaust chamber (Step 201), vacuum evacuation is performed up to a predetermined pressure (Step 202), and then the wafer is carried in the sample chamber (Step 203). The wafer that is carried in the sample chamber is mounted on the electrostatic chuck (Step 204), a predetermined voltage is applied to an internal electrode of the electrostatic chuck (Step 205), and the wafer is adsorbed onto the electrostatic chuck. Continuously, a predetermined retarding voltage is applied to the internal electrode of the electrostatic chuck (Step 206), and then a movement to each measuring point is performed (Step 207). Further, images are acquired and length measurement processing is performed (Step 208). The process is repeated in all the measuring points, and the processes of all the measuring points are completed, and then the wafer is carried out (Step 209).

Figure 3:
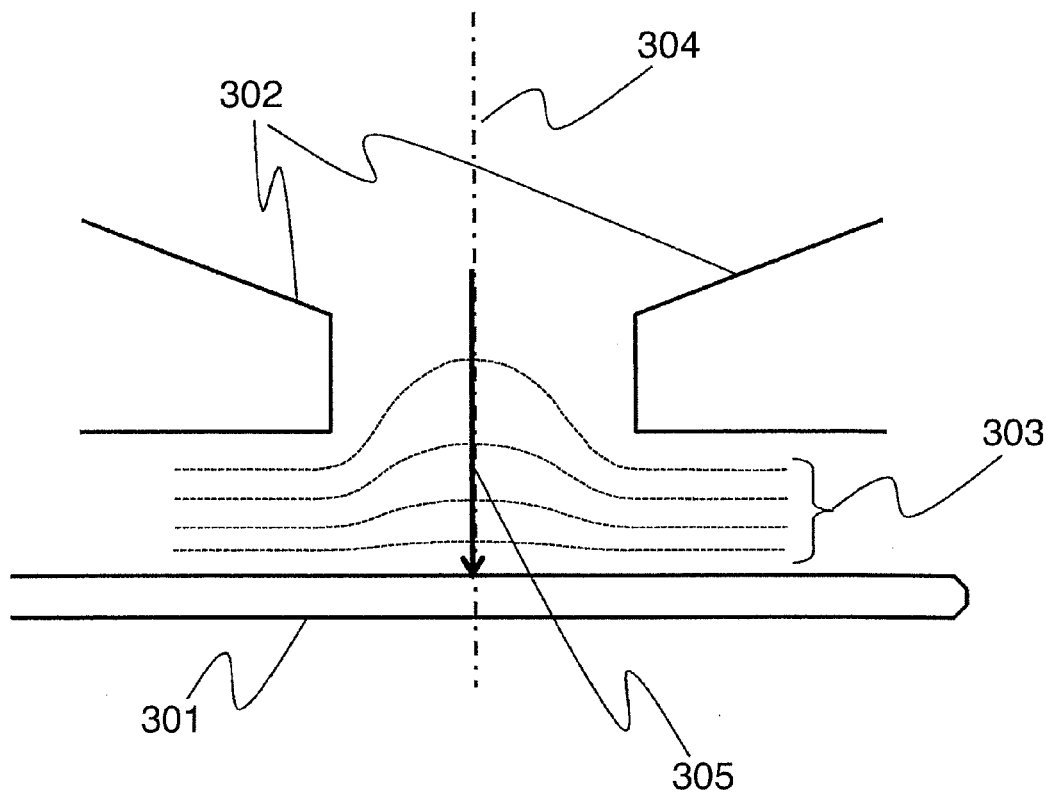
FIG. 3 illustrates a potential distribution near an objective lens at the time of applying a retarding voltage.

FIG. 3 illustrates an appearance of an electric field near an observation point at the time of observing a wafer inner region. A reference numeral 301 denotes a wafer, a reference numeral 302 denotes an electromagnetic lens for converging electron beams, and a broken line 303 denotes an equipotential surface. During the observation, a retarding voltage is applied to an electrode built in the electrostatic chuck. Thereby, a voltage of the wafer 301 is a retarding voltage, an electric field that is axisymmetric with respect to the central axis 304 of the electron beams is formed in a space between the wafer 301 and the electromagnetic lens 302 facing the wafer 301, and the electron beams reach the wafer 301 while drawing an orbit 305 perpendicular to the equipotential surface.

Figure 4:
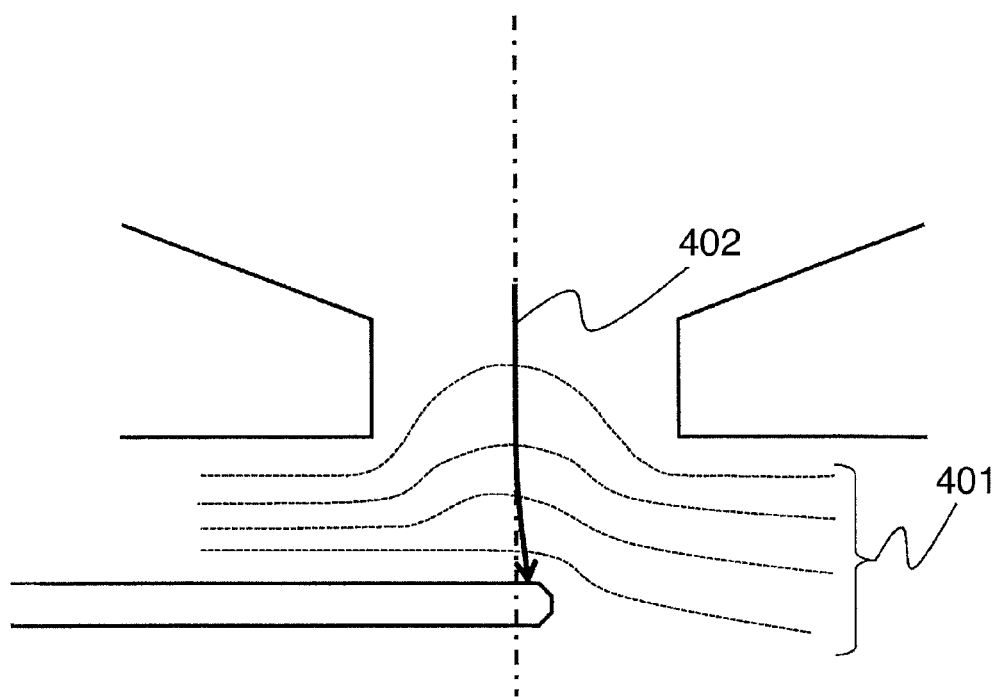
FIG. 4 illustrates a potential distribution near an edge of a sample at the time of applying the retarding voltage.

In the wafer inner region, a peripheral electric field is shielded by the wafer 301 itself, and the axisymmetric electric field is kept, as it is, in a region through which the electron beams pass. On the other hand, as illustrated in FIG. 4, near a periphery of the wafer, for example, when there is no structure around the wafer, steps occur in an equipotential surface 401 as in steps of the wafer itself. Therefore, an axisymmetric property of the electric field collapses in a region through which the electron beams pass. At this time, an orbit 402 of the electron beam is bent by the collapse of the equipotential surface, and therefore an arrival position to the wafer is displaced from a desired position. When this displacement amount is large, a desired pattern is displaced from a field of view of the image and an automatic observation is difficult. Accordingly, an observable range is narrowed up to a range in which an influence due to the steps is not negligible.

Figure 5:
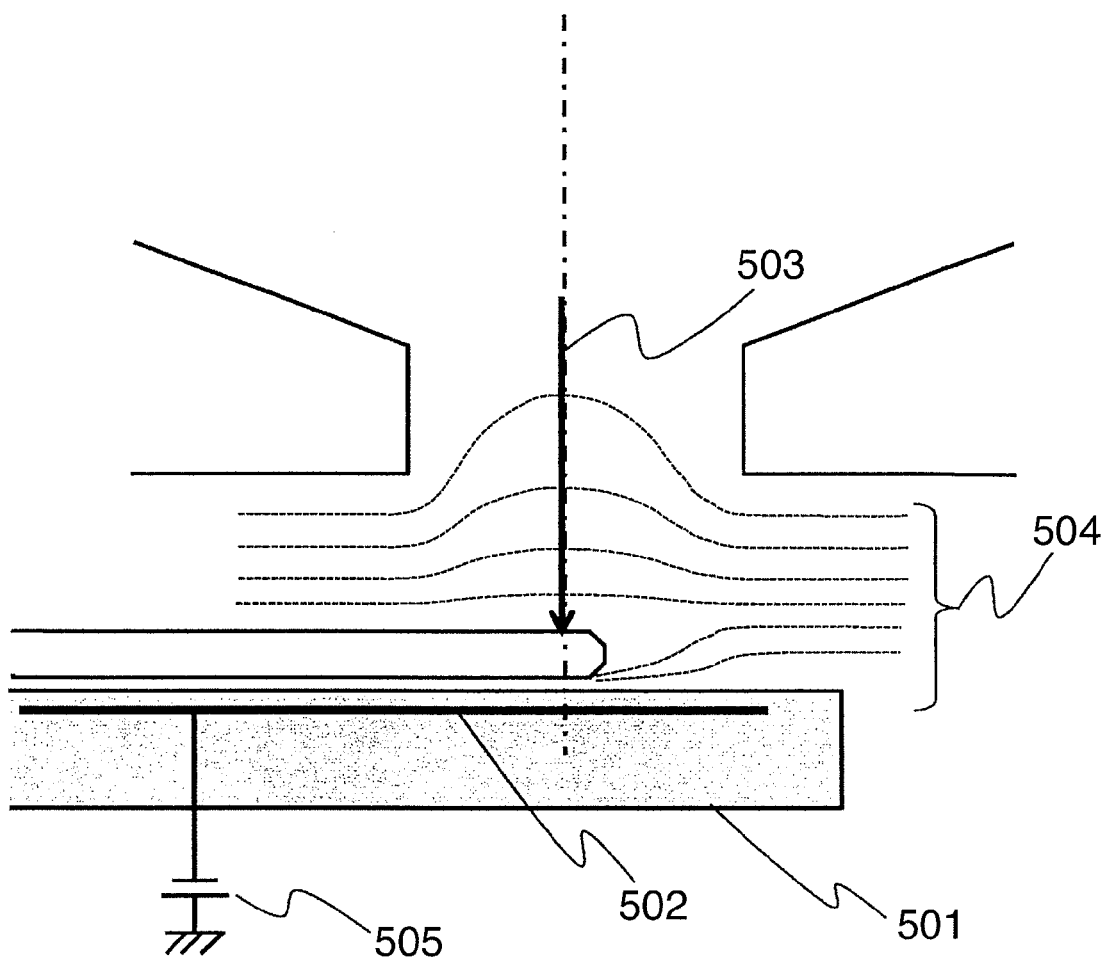
FIG. 5 illustrates an embodiment in which an electric field generated near the edge of the sample at the time of applying the retarding voltage is corrected by applying a voltage to an adsorption electrode of an electrostatic chuck.
Figure 6:
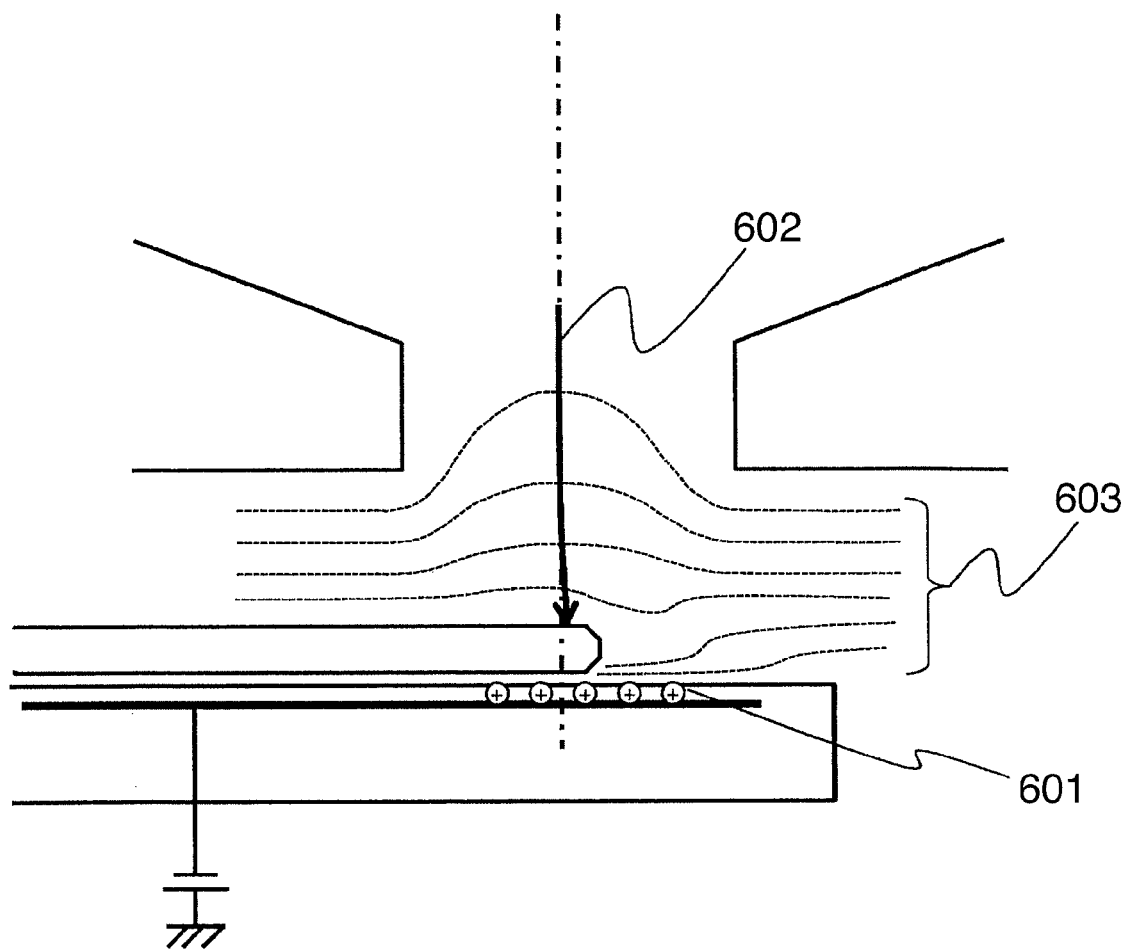
FIG. 6 illustrates an appearance in which a charge is generated on an adsorption face of the electrostatic chuck through a contact, etc. between the sample and the electrostatic chuck.

To suppress the above influence of the electric field, as illustrated in FIG. 5, it is considered that an outer diameter of an electrostatic chuck 501 is larger than that of the wafer and a drop of the electric field due to the steps is pushed back by the electric field generated by an adsorption electrode 502 protruding from the wafer and the electric field 504 that is axisymmetric with respect to an electron beam trajectory 503 is preferably kept up to the periphery of the wafer. However, a surface of the electrostatic chuck 501 is made of ceramics having a high insulation property and therefore, as illustrated in FIG. 6, a charge 601 is formed by a contact or friction between the electrostatic chuck 501 and the wafer, or an irradiation of the electron beams at the time of observing the periphery of the wafer.

Here, as one embodiment, illustrated is an appearance of an electric field in the case in which the electrostatic chuck is positively charged. The electric field generated by the charge on the electrostatic chuck further collapses an axisymmetric property of an equipotential surface 603 on an electron beam trajectory 602 and narrows an observable range. A method is also considered in which the above charge on the electrostatic chuck is also added and an appropriate voltage is applied. However, a charge on an insulator is not normally even but generated extremely locally, and therefore a measurement and correction of the charge are difficult. Therefore, in the electrostatic chuck an outer diameter of which is larger than that of the wafer, the observable range is narrowed up to a range in which an influence of the charge on the electrostatic chuck is negligible.

Figure 7:
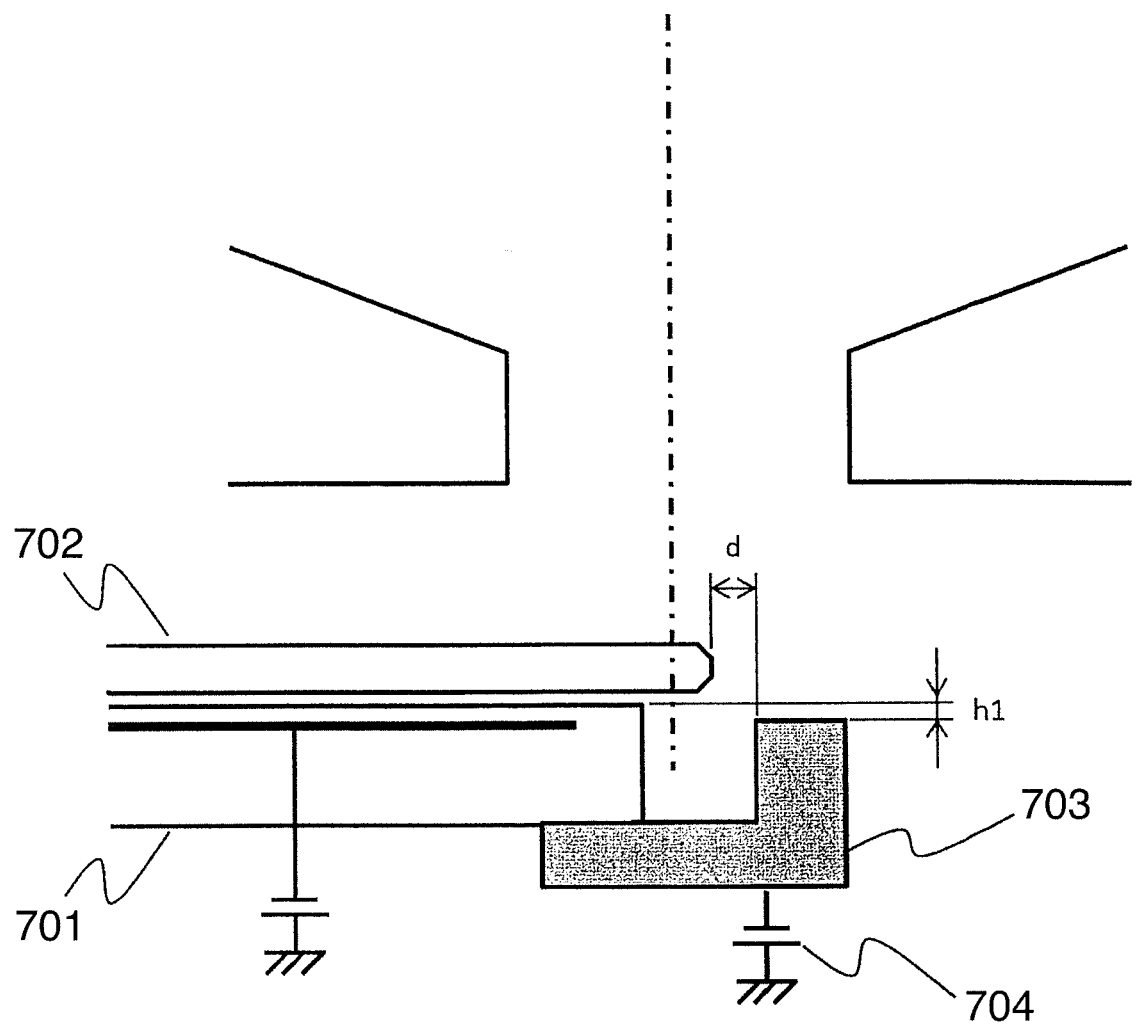
FIG. 7 illustrates one embodiment of the electrostatic chuck in which the vicinity of the edge of the sample is not contacted with the adsorption face of the electrostatic chuck and that includes an electrode for correcting an electric field generated by applying a voltage to the adsorption electrode.

To cope with the above problem, as illustrated in FIG. 7, an outer diameter of an adsorption face of an electrostatic chuck 701 with a wafer 702 is made smaller than that of the wafer 702. Thereby, the above-described influence of the charge is suppressed. The electrostatic chuck 701 exemplified in FIG. 7 is characterized in that the outer diameter thereof is smaller than that of the wafer 702, and an influence of the charge on the surface of the electrostatic chuck 701 is shielded by the wafer itself. On the other hand, a conductive member 703 is provided on an outer side of the wafer 702 and a predetermined voltage Vc is applied thereto, and thereby a disturbance of the electric field is corrected at the time of observing the periphery of the wafer 702. The conductive member 703 has a shape in which both of a downward direction and a side face direction of the wafer 702 are surrounded, and is installed with a gap d between a side face of the wafer 702 and that of the conductive member 703, and a height h1 between a top face of the electrostatic chuck 701 and that of the conductive member 703.

Figure 18:
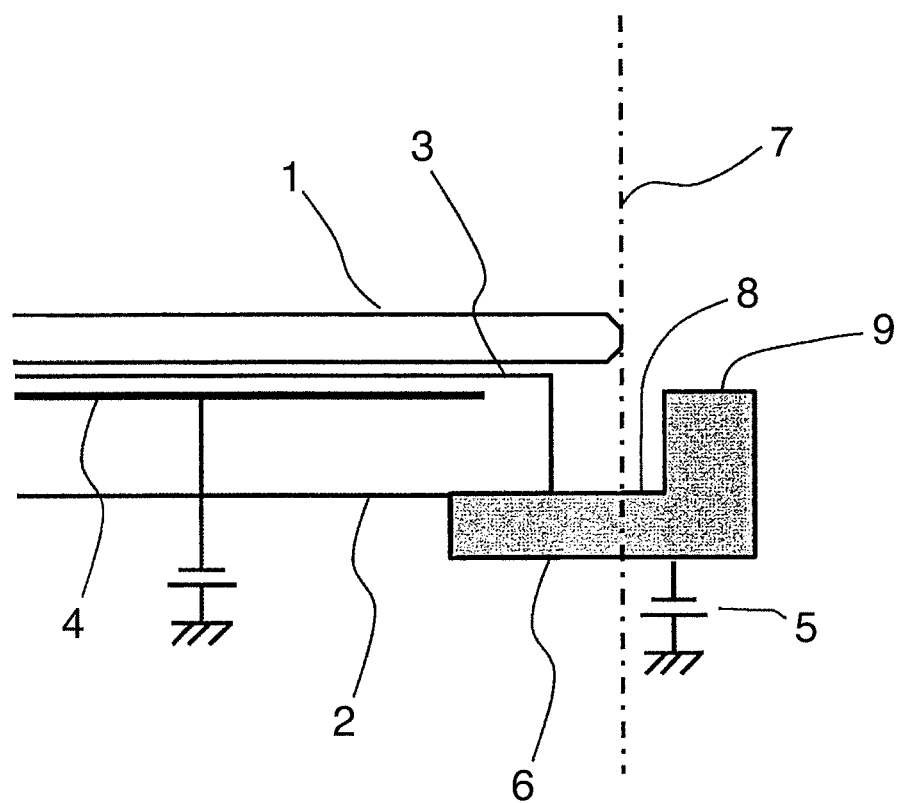
FIG. 18 illustrates a relationship between the sample, the electrostatic chuck, and the correction electrode.

FIG. 18 illustrates arrangement conditions of components of the electrostatic chuck 2 in more detail. A sample adsorption face 3 of the electrostatic chuck 2 is formed smaller than a contact rear face of a sample 1. An adsorption electrode 4 (first electrode) is built in the electrostatic chuck 2 and a voltage is applied thereto in order to generate a coulomb force, etc. In addition, to the adsorption electrode 4, a retarding voltage (not illustrated) for retarding electron beams irradiated on the sample 1 is applied. Further, a first electrode surface 8 is included in a position relatively separated from the sample adsorption face 3 in a Z direction, and an electrode 6 (second electrode) connected to a power supply for electric field correction 5 is connected to the electrostatic chuck 2. The Z direction is the same direction as that of an optical axis of the electron beams, and in this case, the sample adsorption face 3 is an X-Y plane perpendicular to the Z direction. Further, the above-described first electrode face 8 is positioned and the electrode 6 is formed so that a virtual line 7 that contacts an edge of the sample 1 and extends in the Z direction passes.

The reason in which the outer diameter of the sample adsorption face 3 of the electrostatic chuck 2 is made smaller than that of the sample 1 is that as described above, the charge generated near the edge of the sample 1 is suppressed. When the sample adsorption face 3 is present nearby the edge of the sample, a charge may be accumulated by friction, etc. between the sample 1 and the sample adsorption face 3. Further, electrons, etc. generated by irradiating electron beams on the vicinity of the edge of the sample 1 land on the edge, and thereby charges may be accumulated. To suppress the above accumulation of charges, a size of the sample adsorption face 3 is set so that an edge of the sample 1 (contact face side of the edge with the electrostatic chuck 2) is not contacted with the sample adsorption face 3 at the time when the sample 1 is mounted on the electrostatic chuck 2.

Further, when the sample adsorption face 3 is small formed so that the edge of the sample 1 is not contacted with the sample adsorption face 3, an electric field generated by the voltage applied to the adsorption electrode 4 is considered to leak into the edge side. To effectively suppress the above influence of a leakage electric field onto the edge, the electrode 6 having the first electrode face 8 is installed under the edge of the sample 1 (position through which the virtual line 7 passes and that is relatively separated from the sample 1 more than the sample adsorption face 3 and the adsorption electrode 4). According to the above arrangement conditions of the adsorption electrode 4, the leakage electric field toward the edge side of the sample 1 can be suppressed. According to the above configuration, equipotential lines that are formed by using the electrostatic chuck 3 as a basic point can be dragged into the electrode face 8. That is, an amount of the electric field that leaks into the edge can be suppressed, and as a result a beam deflection can be suppressed based on a disturbance of the electric field of the edge.

Figure 8:
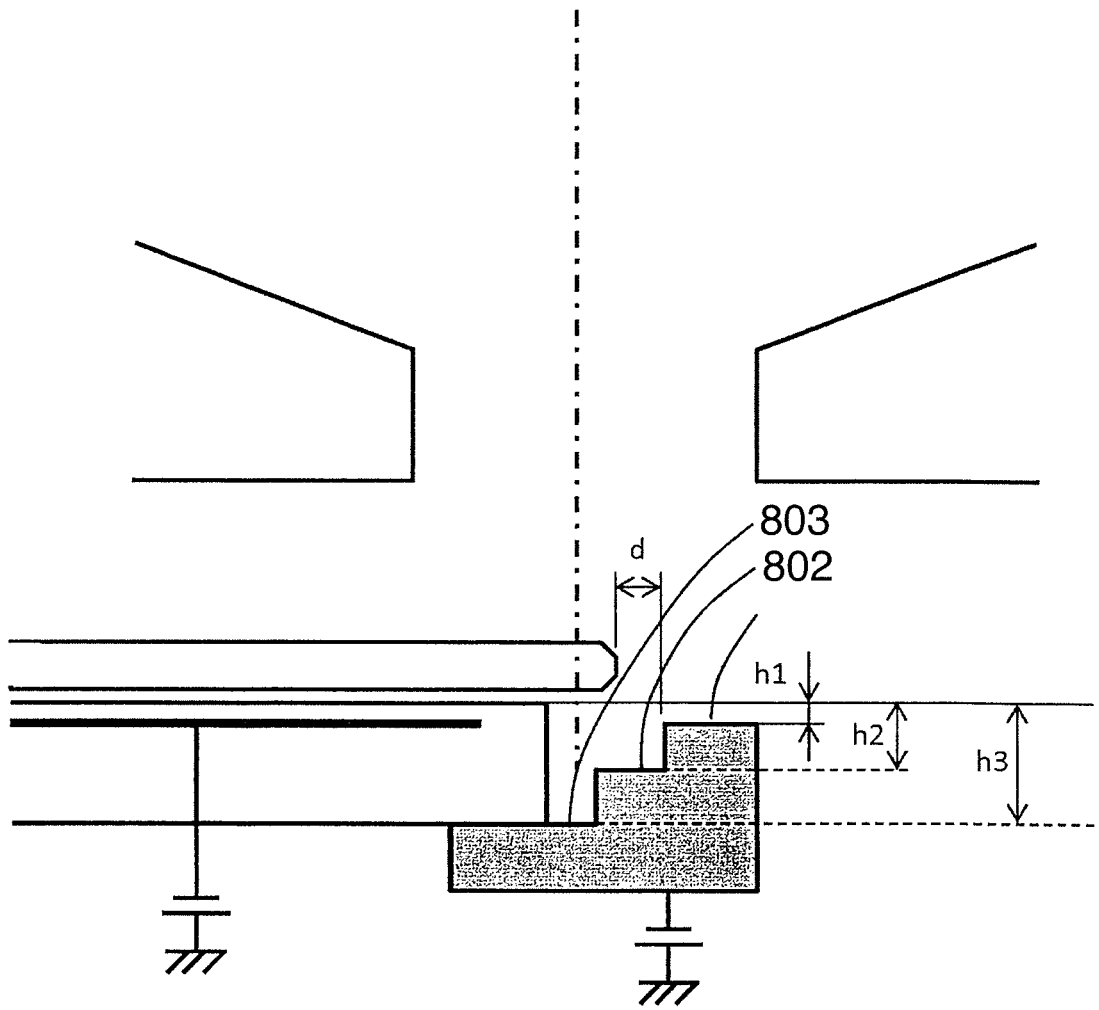
FIG. 8 illustrates another embodiment of the electrostatic chuck in which the vicinity of the edge of the sample is not contacted with the adsorption face of the electrostatic chuck and that includes an electrode for correcting an electric field generated by applying a voltage to the adsorption electrode.

As illustrated in FIG. 8, stair-wise steps may be provided on the conductive member. In an embodiment of FIG. 8, an electrode face 801 is formed in which a difference between the conductive member and the sample adsorption face is h1, an electrode face 802 is formed in which a difference between the conductive member and the sample adsorption face is h2, and an electrode face 803 is formed in which a difference between the conductive member and the sample adsorption face is h3. As illustrated in FIG. 8, a relationship between respective differences is h3>h2>h1. According to the above configuration, a height size h2 of the step and a gap size d in the side face direction are adjusted, and thereby a contribution ratio of the electric field correction from the downward direction and that of the electric field correction from the side face direction can be adjusted and optimization of a correction voltage is more facilitated to be performed.

Further, as exemplified in FIGS. 8 and 18, the correction electrode is configured so that as the second electrode 6 is more separated from the adsorption electrode 4, a height of the electrode face 9 is higher. Thereby, the electric field correction can be performed more accurately. In an embodiment of FIG. 18, the second electrode face 9 is formed so that as the electrode face 9 is more separated from the adsorption electrode 4, it is more approximated to an objective lens side. In embodiments of FIGS. 8 and 18, the edge of the sample is not contacted with other members, and as equipotential lines transmitted through a sample surface are more separated from the sample 1 in the X-Y directions, the equipotential lines face the downward direction more (in the direction separated from the objective lens). When electron beams are irradiated on the vicinity of the edge of the sample 1, the equipotential lines are preferably formed in parallel to a surface of the sample 1. Therefore, to parallelize the equipotential lines with the surface of the sample 1, a structure in which as the electrode face 9 is more separated from the adsorption electrode 4, it is more approximated to the objective lens is adopted as an electrode that forms equipotential lines regressing to a change in the equipotential lines before the correction.

According to the structure exemplified in FIGS. 8 and 18, the correction can be performed so that a potential gradient of the edge is parallelized to the sample surface. Alternatively, the electrode faces may be formed not in a staircase shape but in a slope shape.

Figure 9:
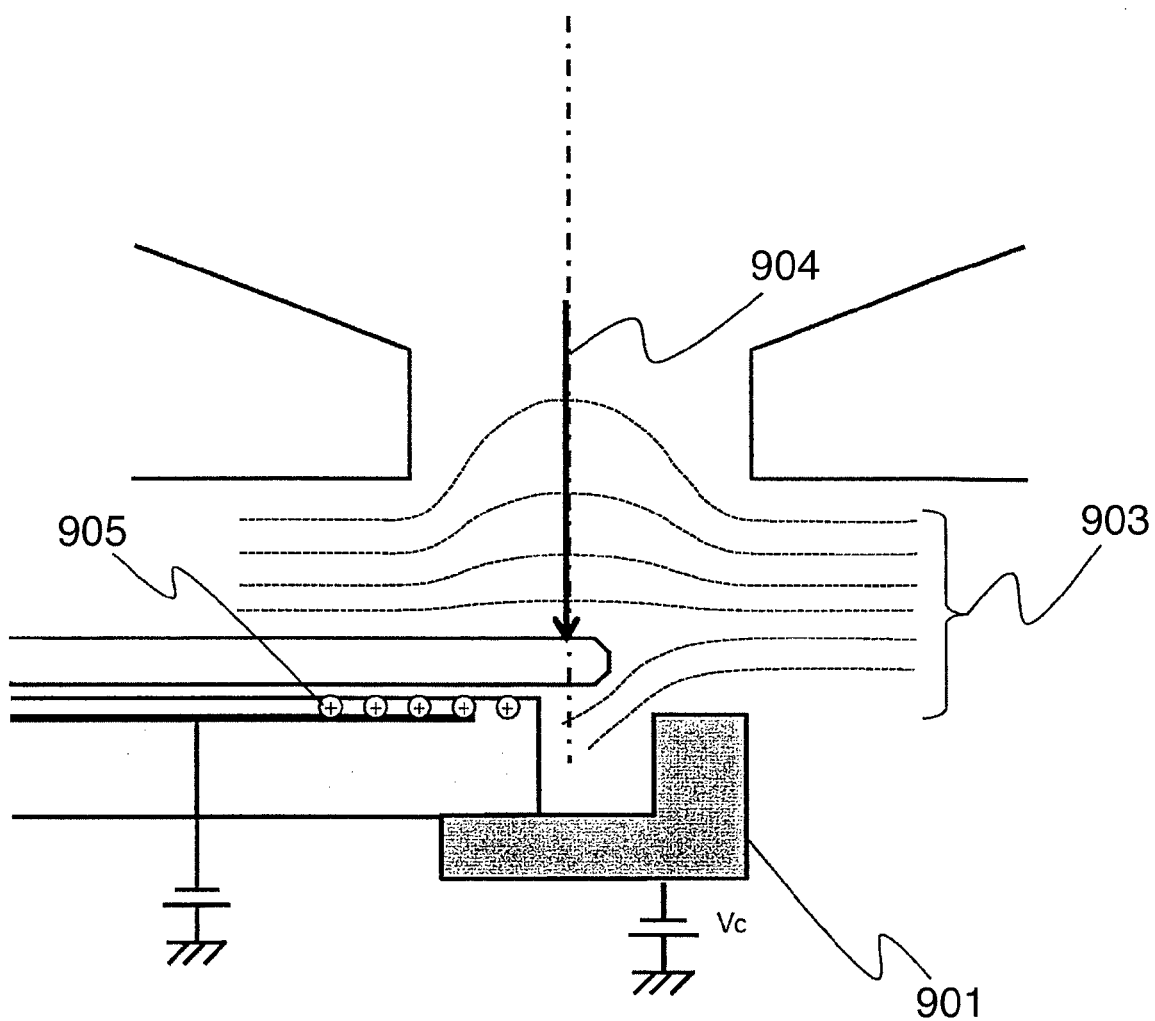
FIG. 9 illustrates an appearance in which the charge generated on the adsorption face of the electrostatic chuck is shielded by the sample.

FIG. 9 illustrates one embodiment of an electric field distribution in the periphery of the sample at the time when the electrostatic chuck includes an adsorption face that is smaller than the sample and an electrode for correcting the electric field is provided under the edge of the sample. The predetermined correction voltage Vc is applied to a conductive member 901, and thereby a drop of an equipotential surface 903 due to the step of the wafer itself is pushed back and the electric field that is axisymmetric with respect to an electron beam trajectory 904 is kept. Charges 905 on the electrostatic chuck are similarly generated also when the outer diameter of the electrostatic chuck is smaller than that of the wafer. However, an electric field generated by the charges 905 is shielded by the wafer itself, and therefore an influence is not exerted on the electron beam trajectory. Through the above configuration, an influence of the charges in the electrostatic chuck is not received but a length measurable range can be extended. Further, the conductive member 901 to which the correction voltage Vc is applied is also grounded via a power supply, and therefore it is not charged.

For example, when the sample is carried while misaligned from an original position, the conductive member 901 is positioned under the sample adsorption face, and thereby a risk of a collision between the electrostatic chuck and the sample can be reduced. As illustrated in FIGS. 7 to 9, the conductive member is positioned lower than the wafer in the height. However, it may be positioned at the same height as or higher than that of the wafer, and a correction effect may be further improved.

Figure 17:
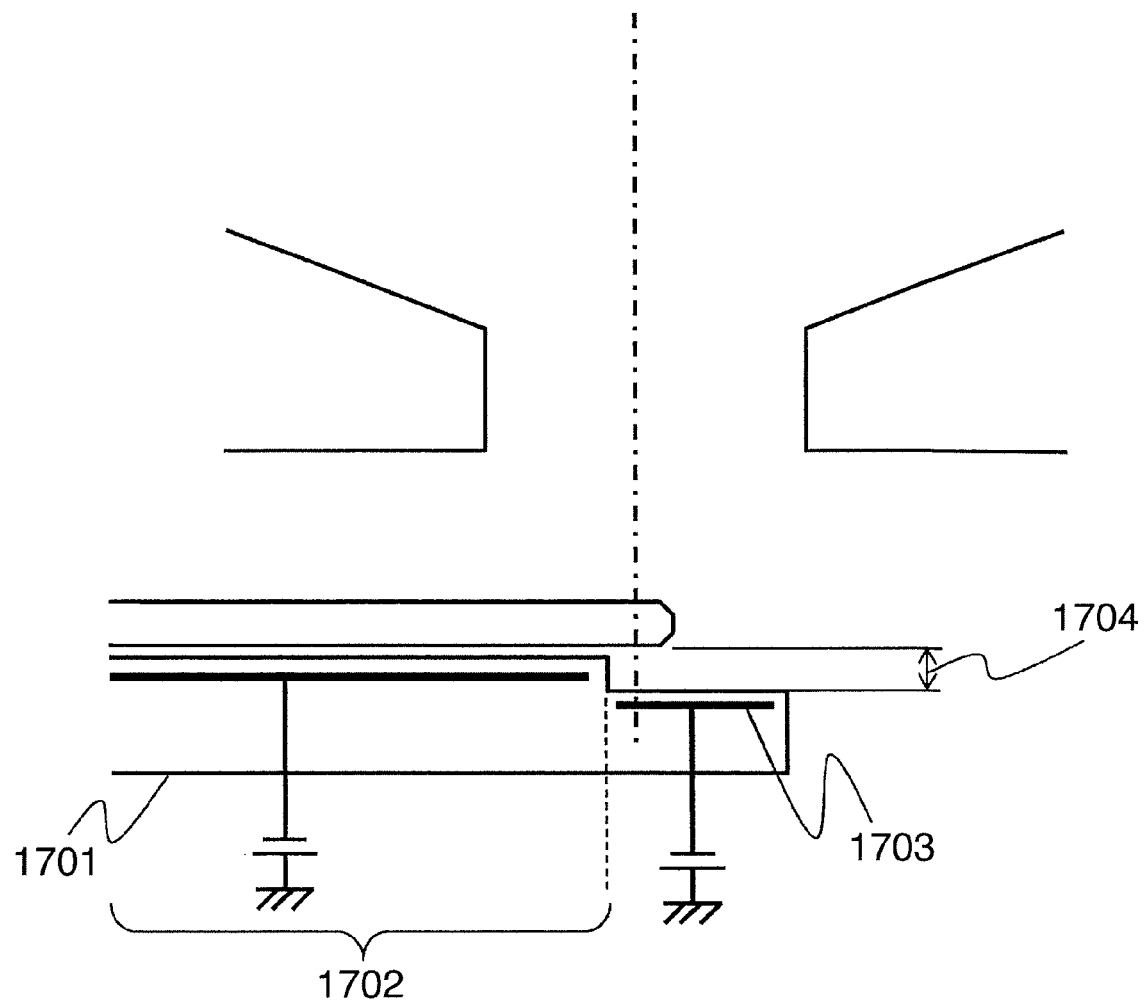
FIG. 17 illustrates an embodiment in which a step is provided on a surface of the electrostatic chuck and a correction electrode is provided in an internal portion on a lower step side of the electrostatic chuck.

Further, the conductive member is not necessarily a separate part from the electrostatic chuck, and the conductive member may be embedded in the electrostatic chuck to be integrated thereinto. As illustrated in FIG. 17, for example, while an outer diameter of a wafer adsorption unit 1702 of an electrostatic chuck 1701 is kept smaller than that of the wafer, a conductive member 1703 is embedded in the electrostatic chuck under the periphery of the wafer. At this time, an external area of the wafer adsorption unit 1702 is made lower than the wafer adsorption unit 1702 and a distance 1704 between a surface of the electrostatic chuck and a rear face of the wafer is kept in a level in which an influence of charges is negligible. Through the above configuration, an influence due to the charges on a surface of the electrostatic chuck is not received but a correction of the electron beam trajectory can be performed. In the present embodiment, an inner diameter of the conductive member is made smaller than an outer diameter of the wafer. The inner diameter of the conductive member may be larger than the outer diameter of the wafer; however, as in the present embodiment, when the inter diameter of the conductive member is smaller than the outer diameter of the wafer, a voltage application sequence in which a carrying variation of the wafer or a gap between the electrodes and the wafer is considered is not required but a correction of the electron beam trajectory is facilitated to be performed, as described in a fourth embodiment.

Further, when the edge of the sample is not simply contacted with the sample adsorption face, the steps are only provided on the sample adsorption face side of the electrostatic chuck and a difference of elevation is not required to be provided between the adsorption electrode and the conductive member 1703. However, for increasing a coulomb force, etc. as much as possible, a distance between the adsorption electrode and the sample is preferably reduced. Therefore, as exemplified in FIG. 17, it is preferable that the adsorption electrode is built in a projection part on the surface side of the electrostatic chuck, and as a result the difference of elevation is provided between the adsorption electrode and the conductive member 1703. Further, two electrodes are separated from each other in the height direction (Z direction), and therefore even if two electrodes are approximated to each other in the X-Y directions, a risk of discharge does not increase but an electrode arrangement in which an effect of the electric field correction is considered can be performed.

Figure 10:
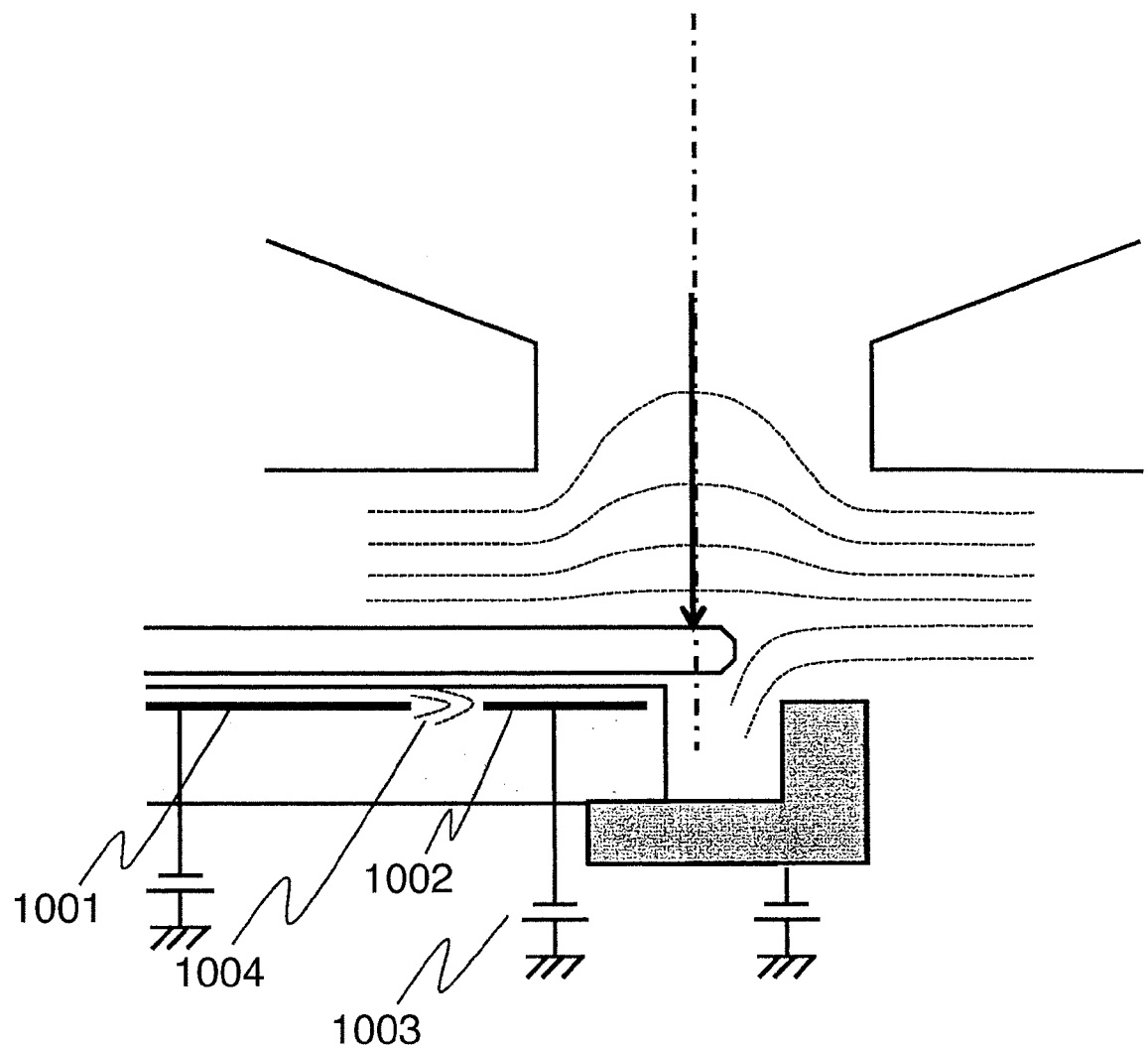
FIG. 10 illustrates an embodiment in which a screening electrode is provided inside the electrostatic chuck.
Figure 11:
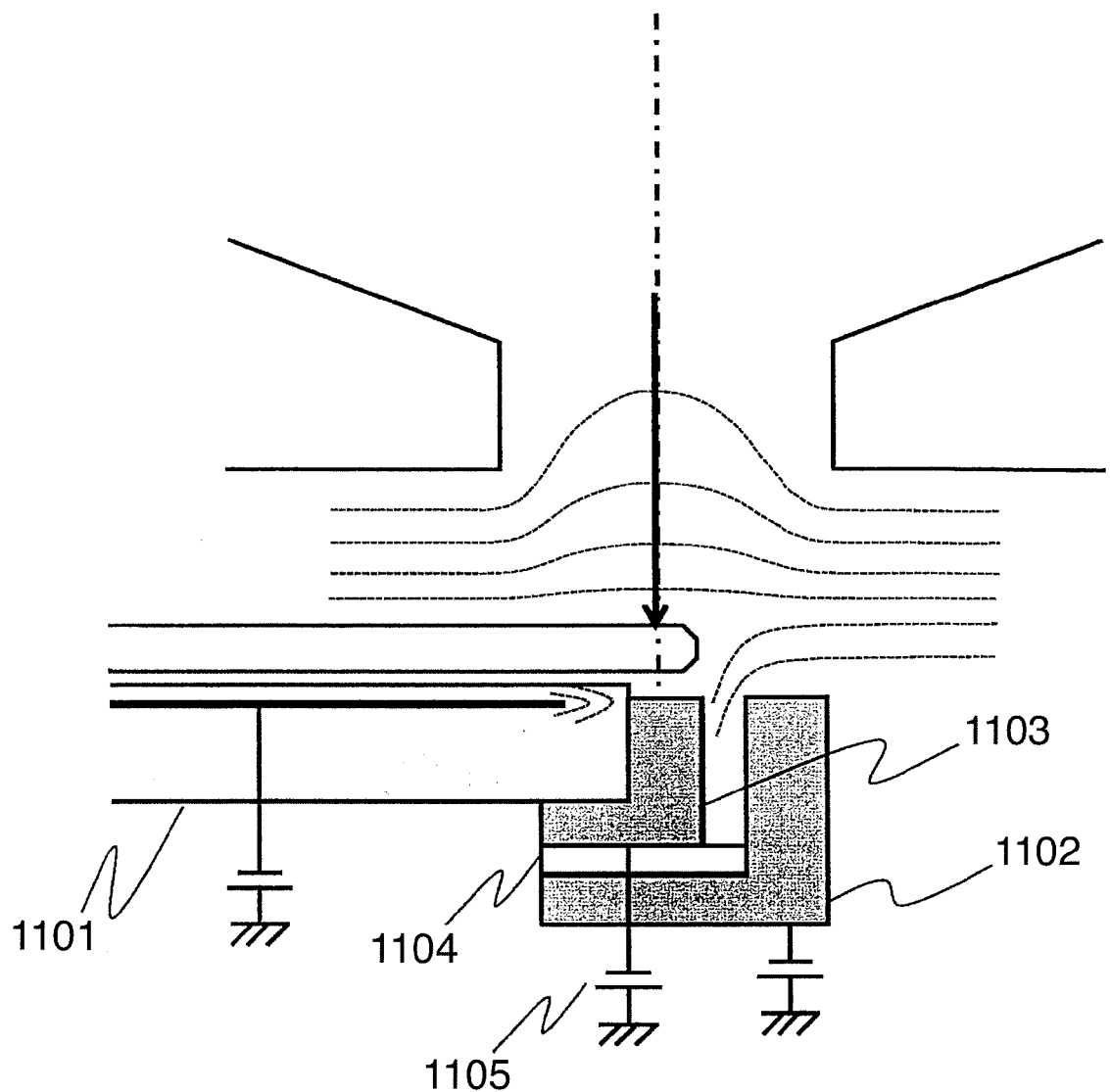
FIG. 11 illustrates an embodiment in which the screening electrode is provided outside the electrostatic chuck.

Continuously, a second embodiment will be described with reference to FIG. 10. In addition to the first embodiment, the second embodiment is characterized in that a screening electrode 1002 (third electrode) is provided at the outermost periphery on the outside of the adsorption electrode 1001 in the electrostatic chuck. The screening electrode 1002 is connected to the retarding power supply 1003 that is the same voltage as that of the wafer. In the first embodiment, an influence of the charges on a surface of the electrostatic chuck is shielded by making the outer diameter thereof smaller than that of the wafer; further, the electric field generated by the adsorption electrode of the electrostatic chuck also exerts some extent of influence on the periphery of the wafer. When the retarding voltage being the same voltage as that of the wafer is applied to the electrode at the outermost periphery, the electric field 1004 generated by the adsorption electrode can be shielded. However, in the case of the above configuration, an adsorption region of the electrostatic chuck is restricted by the region of the screening electrode. When an influence of an internal electrode is desired to be shielded while the adsorption region is also secured sufficiently, a shield member 1103 may be provided not within the electrostatic chuck 1101 but between the electrostatic chuck 1101 and a conductive member 1102 via an insulating member 1104. Through the above configuration, when the retarding voltage 1105 is applied to the shield member 1103, the adsorption region of the electrostatic chuck can be sufficiently secured while an influence of the electric field in the internal electrode is shielded. Here, the shield member is described to be a separate member from an ESC (Electrostatic Chuck), and further the shield member may be formed by applying conductive coating to the periphery of the ESC.

Figure 12:
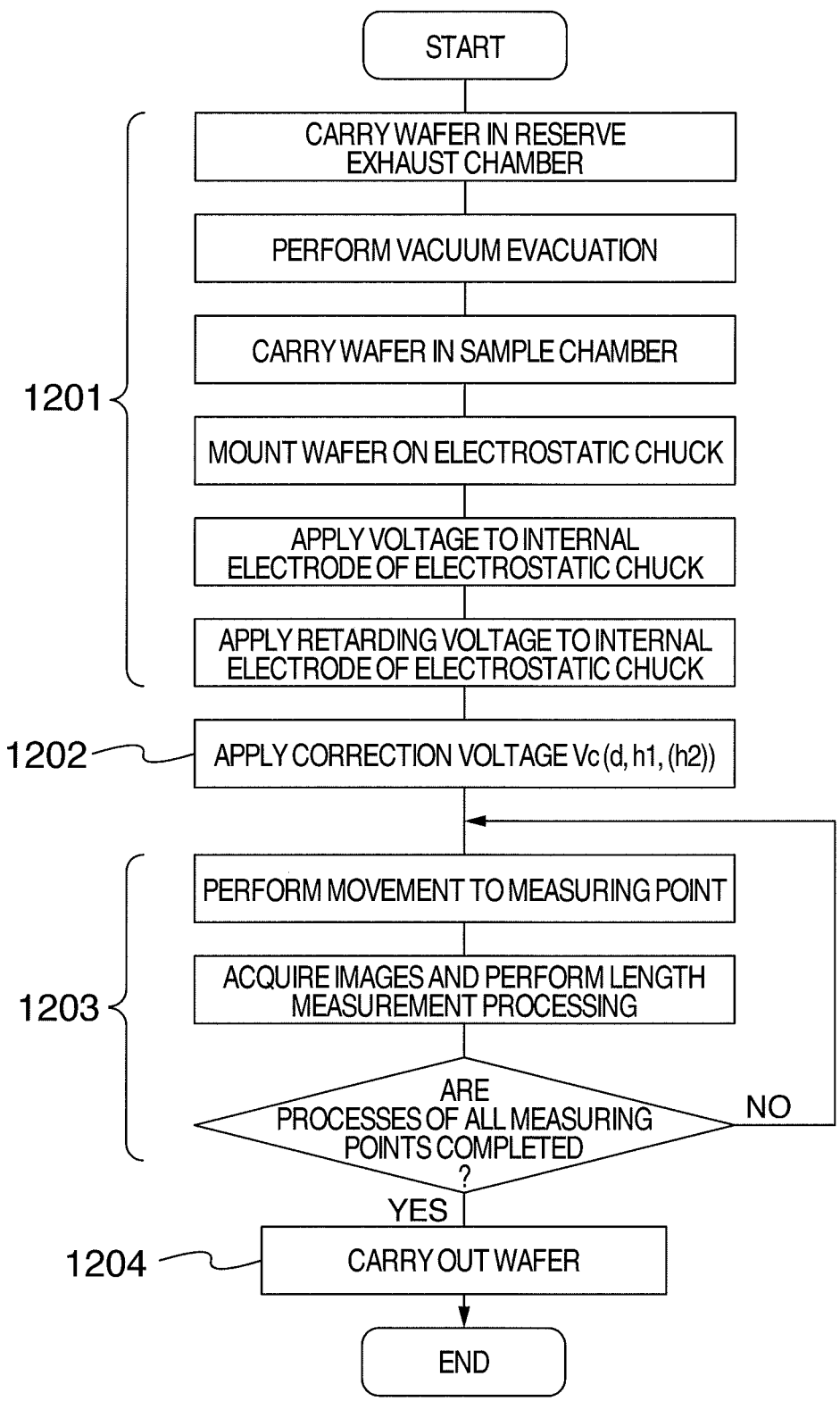
FIG. 12 is a flowchart illustrating a measurement process of the semiconductor wafer by using the scanning electron microscope.

FIG. 12 illustrates a measurement flow of the CD-SEM according to the first embodiment and the second embodiment. First, the wafer is carried in the sample chamber, and a voltage is applied to an internal electrode of the electrostatic chuck and the retarding voltage is applied to the internal electrode of the electrostatic chuck (Step 1201). Subsequently, a predetermined voltage Vc is applied to the conductive member (Step 1202). As a value Vc of the voltage to be applied at this time, selected is an optimum voltage value Vc (d, h1, and (h2)) determined by the gap d between a side face of the conductive member and that of the wafer, a height h1 of the conductive member, or a height h2 of the stepped part in the case in which the steps are present. Then, length measurement processing is performed at each measuring point (Step 1203), and when the length measurement processing is completed, the wafer is carried out (Step 1204). Through the above flow, an appropriate voltage is always applied to the conductive member during observation of the wafer. Therefore, also when a length of any portion on the wafer is measured, a measuring position is not recognized but an observable range can be secured.

Figure 13:
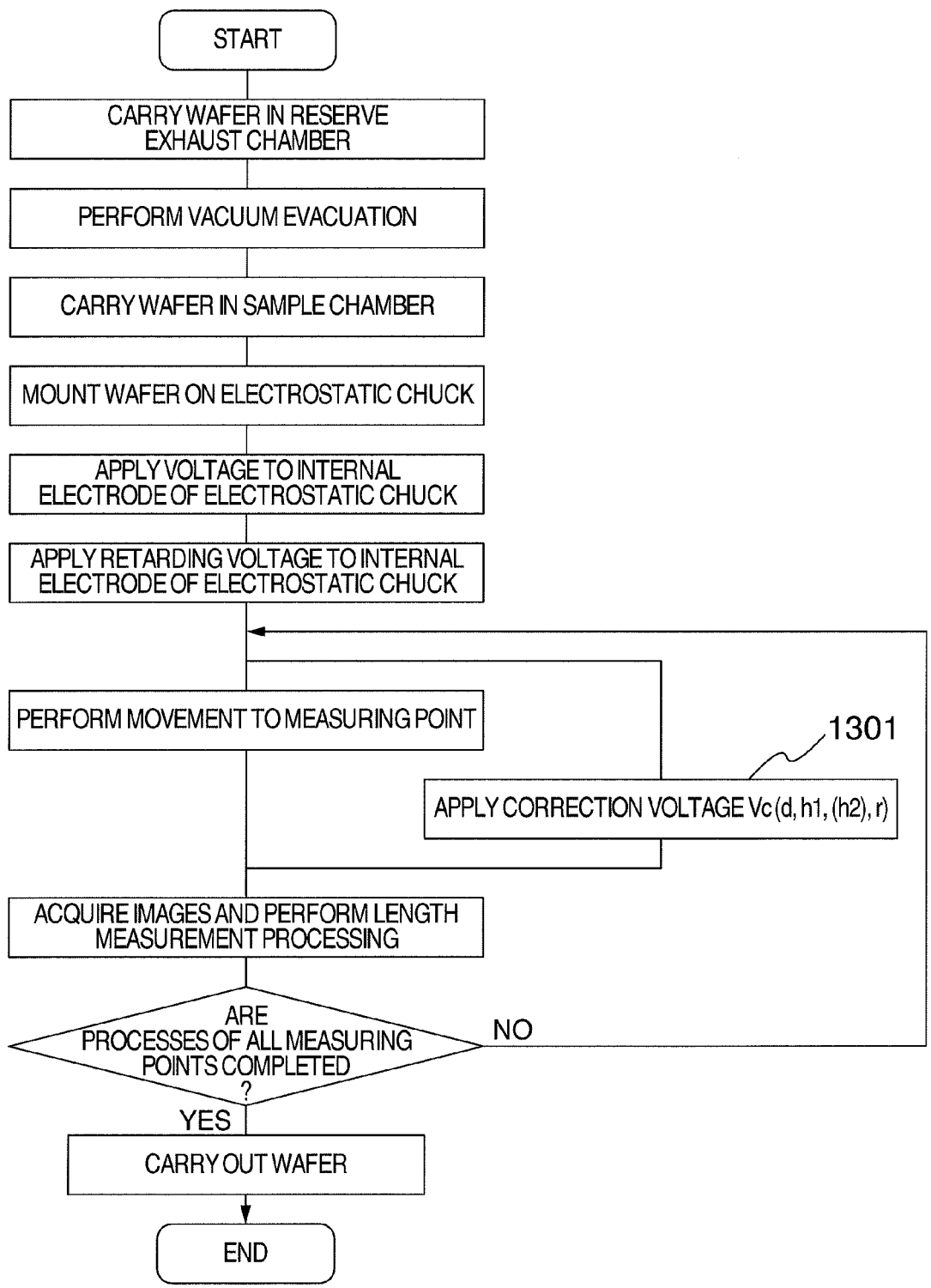
FIG. 13 is a flowchart illustrating a measurement process of the semiconductor wafer by using the scanning electron microscope.

Next, in addition to the first embodiment and the second embodiment, in the third embodiment, a measurement flow of the CD-SEM that further extends a length measurable area will be described. The electric field near the edge of the wafer is, as approaching the edge, more facilitated to receive an influence of a disturbance of the electric field in the stepped part. Therefore, an optimum voltage to be applied to the correction electrode is delicately different depending on a difference of a slight distance from the edge of the wafer at an observation position. FIG. 13 illustrates a measurement flow of the CD-SEM according to the third embodiment. After the application of the retarding voltage, the correction voltage Vc is not applied as a constant voltage, but a distance r from a center of the wafer is calculated for each movement at each measuring point (beam irradiation point) and the optimum voltage Vc (d, h1, (h2), and r) corresponding to the distance r is applied to the conductive member (Step 1301). Through the above flow, the optimum correction voltage can be applied to the conductive member in each observation position, and therefore the length measurable area can be further extended. Further, resetting of the voltage for each measurement is performed in parallel to a movement of the stage, and therefore throughput of the apparatus is not reduced.

Figure 14:
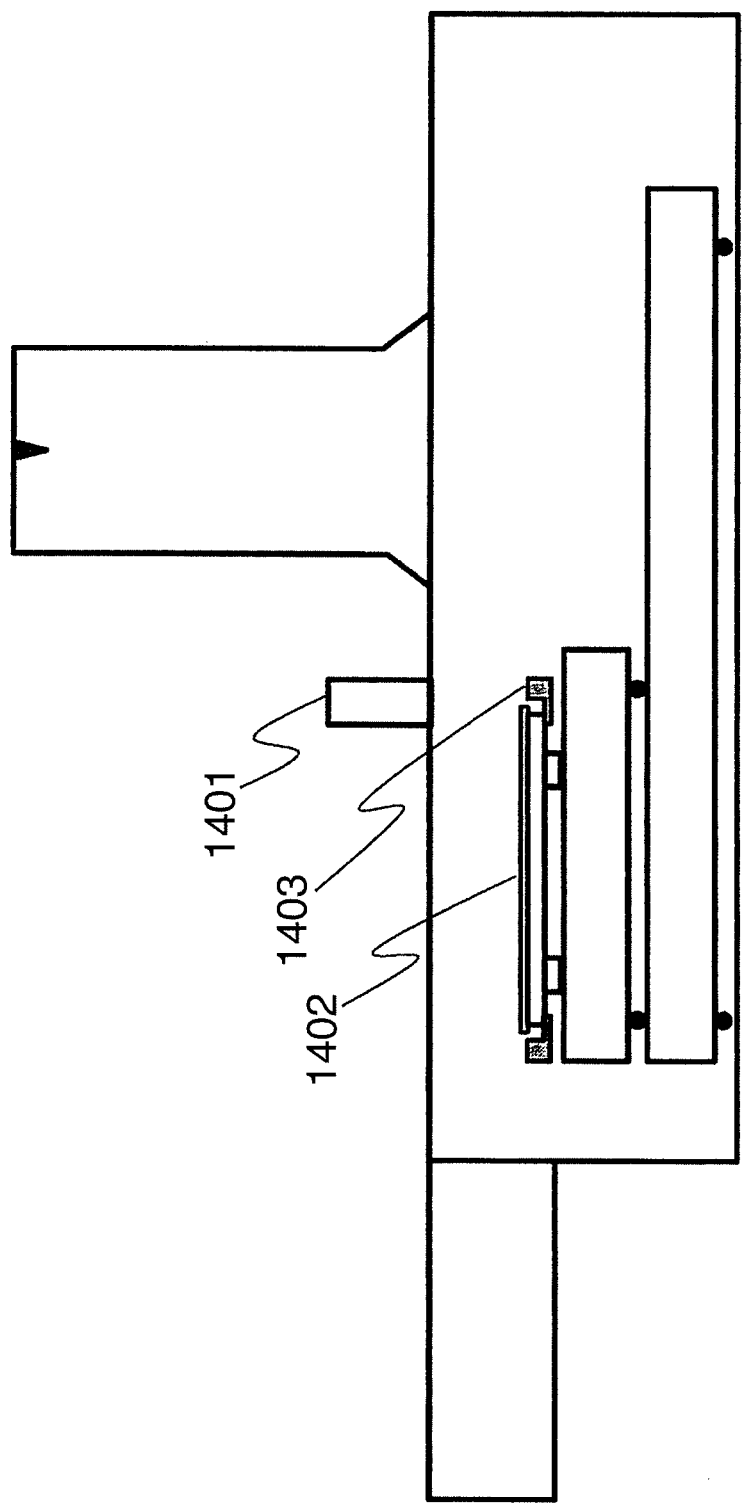
FIG. 14 illustrates an outline of the scanning electron microscope.
Figure 15:
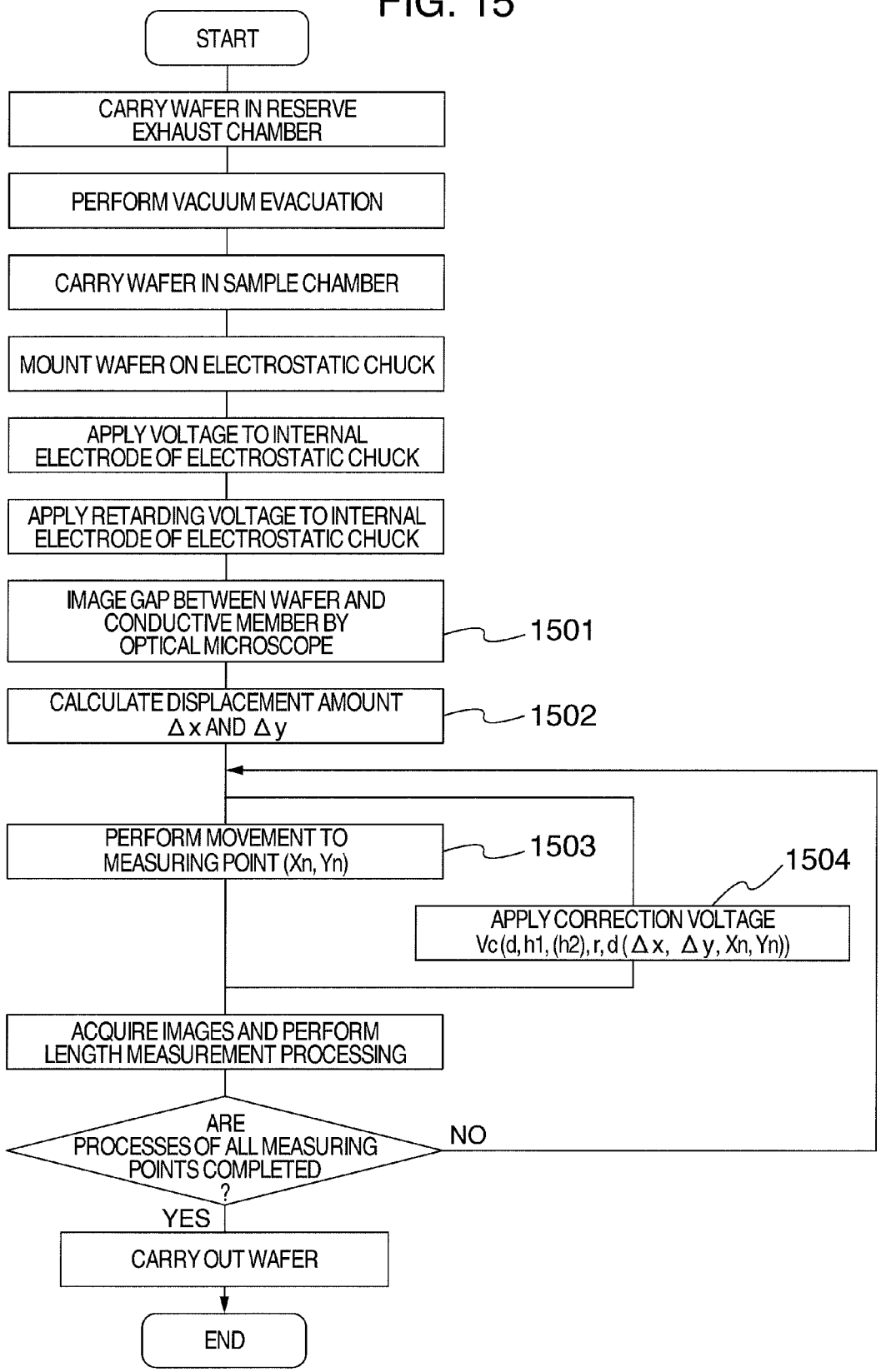
FIG. 15 is a flowchart illustrating a measurement process of the semiconductor wafer by using the scanning electron microscope.
Figure 16:
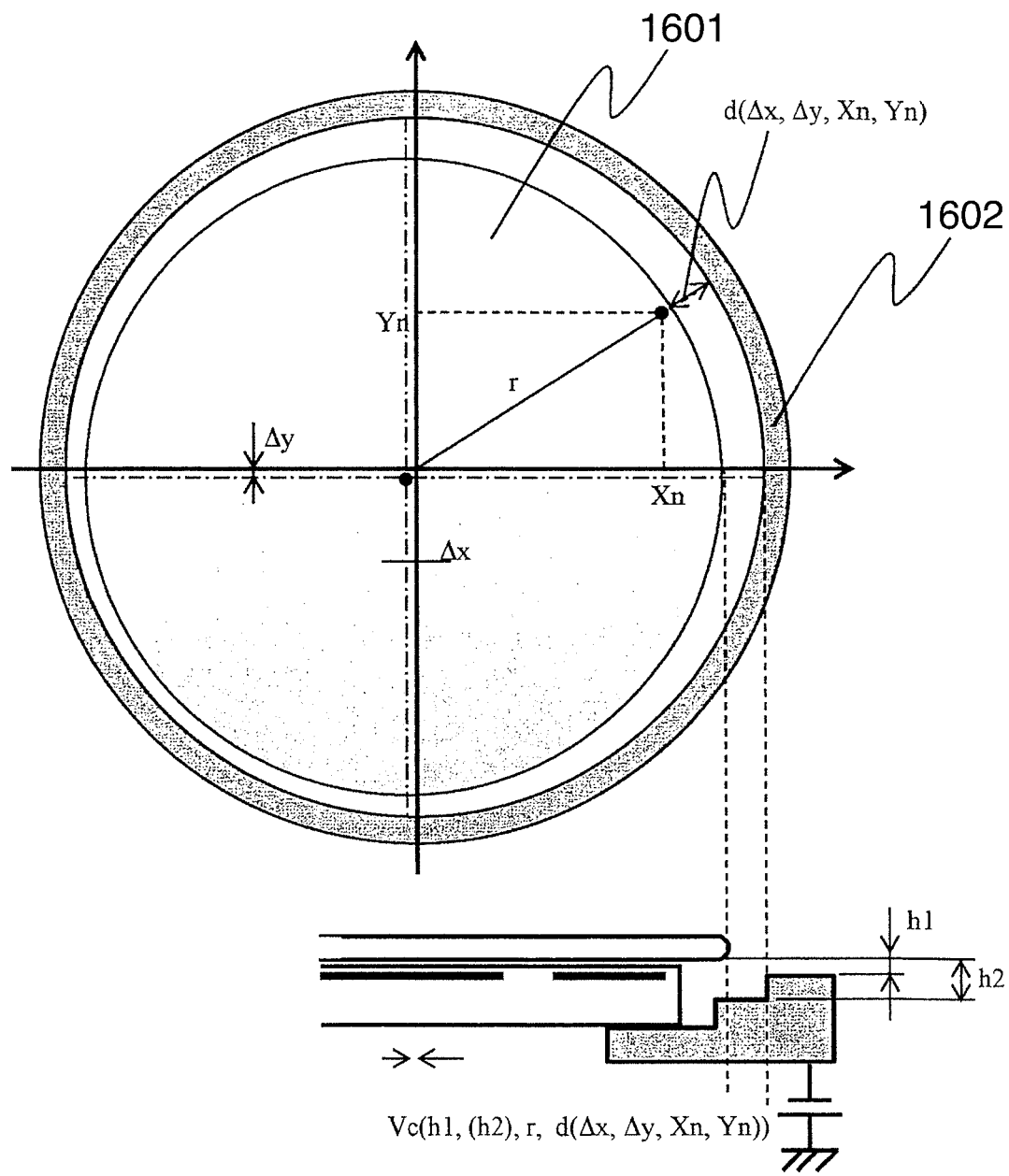
FIG. 16 illustrates a relationship between a sample position and an application voltage to an electrode for correcting an electric field.

Continuously, the fourth embodiment will be described. In a position of the wafer mounted on the electrostatic chuck, a variation in a carrying accuracy is present as much as an error toward the center of the electrostatic chuck. The same variation is given to the gap between the edge of the wafer and the conductive member installed on the outside of the electrostatic chuck. When the center of the conductive member and that of the wafer are displaced from each other, a size of the gap is different depending on a location in the angle direction of the wafer, for embodiment, the gap between the wafer and the conductive member is comparatively narrow in the direction in which the wafer is displaced, or the gap therebetween is comparatively wide in the direction on the opposite side. With reference to FIGS. 14 and 15, the CD-SEM that is capable of correcting variations in the gap due to the above carrying accuracy, and the measurement flow will be described. After the wafer is carried in the sample chamber, a gap between a wafer 1402 and a conductive member 1403 is first imaged in plurality by a position detection device such as an optical microscope 1401 illustrated in FIG. 14 (Step 1501), and a displacement amount Δx and Δy of the wafer is calculated by image processing (Step 1502). At the time of the movement to each measuring point (Xn, Yn) (Step 1503), the optimum correction voltage Vc (h1, (h2), r, d (Δx, Δy, Xn, Yn) is applied in accordance with not only a distance r from the center of the wafer but also the gap d(Δx, Δy, Xn, Yn) between the wafer and the conductive member in the direction of the observation position (Xn, Yn) determined by the displacement amount Δx and Δy (Step 1504). A position relationship between parameters for determining the above optimum voltage Vc is illustrated in FIG. 16.

By the gap d (Δx, Δy, Xn, Yn) determined by the displacement amount Δx and Δy and the observation position (Xn, Yn) of the wafer 1601, the distance r from the center of the wafer, and the height h1 and (h2) of the conductive member 1602, the optimum voltage Vc is determined. Through the above flow, the correction can be performed in consideration of the carrying variation of the wafer, and the observable range can be further extended. Here, a displacement of the wafer is measured by the optical microscope, and further may be measured by a licenser.

According to the above-described configuration, in the scanning electron microscope using the electrostatic chuck, an influence of the internal electrode of the electrostatic chuck and that of the charges accumulated on the electrostatic chuck during the operation of the apparatus are not received. Therefore, a stable observable range can be secured.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electrostatic chuck mechanism comprising:
   a first plane that is a plane of a side in which a sample is adsorbed;
   a first electrode to which a voltage for generating an adsorptive power between the first plane and the sample is applied; and
   a second electrode that is arranged in a position relatively separated from the sample toward the first plane and through which a virtual line that is perpendicular to the first plane and contacts an edge of the sample passes, wherein
   the electrostatic chuck mechanism is formed so that a size in an insulating plane direction of the electrostatic chuck mechanism is smaller than that of the sample for avoiding positioning the insulating plane of the electrostatic chuck mechanism on the virtual line between the edge and a surface of the second electrode.

2. The electrostatic chuck mechanism according to claim 1, wherein
   the second electrode has a plane having a different height in a direction of the virtual line, and
   the plane having the different height is higher as more separated from the first electrode.

3. The electrostatic chuck mechanism according to claim 2, wherein
   the second electrode is formed in a staircase shape or in a slope shape.

4. The electrostatic chuck mechanism according to claim 1, wherein
   a third electrode is arranged between the first electrode and the second electrode.

5. The electrostatic chuck mechanism according to claim 4, wherein
   same voltage is applied to the first electrode and the third electrode.

6. The electrostatic chuck mechanism according to claim 1, wherein
   the second electrode is arranged so as to surround the first electrode.

7. A charged particle beam apparatus comprising:
   a beam column that irradiates a charged particle beam;
   a sample stage that moves a sample on which the charged particle beam is irradiated;
   an electrostatic chuck mechanism including a first plane that is a plane of a side in which the sample is adsorbed, and a first electrode to which a voltage for generating an adsorptive power between the first plane and the sample is applied; and
   a second electrode that is arranged in a position relatively separated from the sample toward the first plane and through which a virtual line that is perpendicular to the first plane and contacts an edge of the sample passes, wherein
   the electrostatic chuck mechanism is formed so that a size in an insulating plane direction of the electrostatic chuck mechanism is smaller than that of the sample for avoiding positioning the insulating plane of the electrostatic chuck mechanism on the virtual line between the edge and a surface of the second electrode.

8. The charged particle beam apparatus according to claim 7, further comprising:
   a control device that adjusts a voltage applied to the second electrode in accordance with a portion on which the charged particle beam is irradiated.

9. The charged particle beam apparatus according to claim 8, further comprising
   a position detection device that detects a position of the sample, wherein
   the control device adjusts a voltage applied to the second electrode on a basis of a position detection result of the position detection device.

10. A charged particle beam apparatus comprising:
    a beam column that irradiates a charged particle beam;
    a sample stage that moves a sample on which the charged particle beam is irradiated;
    an electrostatic chuck mechanism including a first plane that is a plane of a side in which the sample is adsorbed, and a first electrode to which a voltage for generating an adsorptive power between the first plane and the sample is applied;
    a second electrode that is arranged in a periphery of the first electrode; and
    a control device that adjusts a voltage applied to the second electrode in accordance with a portion on which the charged particle beam is irradiated;
    wherein the electrostatic chuck mechanism is formed so that a size in an insulating plane direction of the electrostatic chuck mechanism is smaller than that of the sample for avoiding positioning the insulating plane of the electrostatic chuck mechanism on the virtual line between the edge and a surface of the second electrode.

* * * * *